(12) United States Patent
Song et al.

(10) Patent No.: US 10,438,305 B2
(45) Date of Patent: Oct. 8, 2019

(54) BUILDING ENERGY SPLIT CALCULATION AND VISUALIZATION

(71) Applicant: Siemens Corporation, Iselin, NJ (US)

(72) Inventors: Zhen Song, Plainsboro, NJ (US); Xianjun S. Zheng, Plainsboro, NJ (US); Sanjeev Srivastava, Princeton, NJ (US)

(73) Assignee: SIEMENS CORPORATION, Iselin, NJ (US)

(*) Notice: Subject to any disclaimer, the term of this patent is extended or adjusted under 35 U.S.C. 154(b) by 0 days.

(21) Appl. No.: 15/468,154

(22) Filed: Mar. 24, 2017

(65) Prior Publication Data

US 2018/0276767 A1 Sep. 27, 2018

(51) Int. Cl.
| | |
|---|---|
| G06Q 50/06 | (2012.01) |
| G06F 1/3203 | (2019.01) |
| G01R 21/00 | (2006.01) |
| F24F 11/46 | (2018.01) |
| F24F 11/00 | (2018.01) |
| G05B 15/02 | (2006.01) |

(Continued)

(52) U.S. Cl.
CPC .......... *G06Q 50/06* (2013.01); *F24F 11/0001* (2013.01); *F24F 11/46* (2018.01); *F24F 11/52* (2018.01); *F24F 11/63* (2018.01); *G01R 21/00* (2013.01); *G05B 15/02* (2013.01); *G06F 1/3203* (2013.01); *F24F 2140/20* (2018.01); *F24F 2140/60* (2018.01); *G05B 2219/2639* (2013.01); *G05B 2219/2642* (2013.01)

(58) Field of Classification Search
None
See application file for complete search history.

(56) References Cited

U.S. PATENT DOCUMENTS

| | | | | |
|---|---|---|---|---|
| 2009/0308941 | A1* | 12/2009 | Patch | F24F 11/0001 236/49.3 |
| 2010/0082161 | A1* | 4/2010 | Patch | F24F 11/0001 700/276 |

(Continued)

FOREIGN PATENT DOCUMENTS

WO  2016148651 A1  9/2016

OTHER PUBLICATIONS

John Murphy, High-Performance VAV Systems, Oct. 2011, p. 18-28.*

(Continued)

*Primary Examiner* — Tung S Lau (57) ABSTRACT

A computer-implemented method of splitting whole building energy consumption includes collecting sensor data from a plurality Variable Air Volume (VAV) boxes in a building, an electric meter in the building, and a gas meter in the building. The total heating energy consumption is split across a plurality of zones within the building using the sensor data, thereby yielding heating energy consumption for each zone. The total cooling energy consumption is split across the plurality of zones using the sensor data, thereby yielding cooling energy consumption for each zone and the total ventilation energy consumption is split across the plurality of zones using the sensor data, thereby yielding ventilation energy consumption for each zone. Zone energy consumption by aggregating the heating energy consumption for the zone, the cooling energy consumption for the zone, and the ventilation energy consumption for the zone.

9 Claims, 7 Drawing Sheets

(51) Int. Cl.
*F24F 11/63* (2018.01)
*F24F 11/52* (2018.01)
*F24F 140/20* (2018.01)
*F24F 140/60* (2018.01)

(56) References Cited

U.S. PATENT DOCUMENTS

| | | | | |
|---|---|---|---|---|
| 2011/0000182 | A1* | 1/2011 | Lasker | F02C 1/04 60/39.24 |
| 2013/0035794 | A1 | 2/2013 | Imani | |
| 2015/0167999 | A1* | 6/2015 | Seem | F24F 11/0009 700/276 |
| 2017/0003043 | A1 | 1/2017 | Thiebaux et al. | |
| 2017/0300599 | A1* | 10/2017 | Becerik-Gerber | G06F 17/5009 |

OTHER PUBLICATIONS

Understanding Single-Zone VAV Systems 2013, pp. 1-10.*
Jason Koh, Sep. 17, 2015, HVACMeter: Apportionment of HVAC Power to Thermal Zones and Air Handler Units.*
"Demo Abstract: Social Learning SoftThermostat for Commercial Buildings" Z. Song et al. Buildsys 2012; Toronto, ON, Canada, ACM 978-1-4503-1170-0 / Nov. 6, 2012.
"Collaborative Building Control to Optimize Energy Saving and Improve Occupants' Experience"; Z. Song et al.; Jan. 28, 2013 / Jan. 28, 2013.
"Advanced, Integrated Control for Building Operations to Achieve 40% Energy Saving" Dr. Yan Lu et al.; Oct. 15, 2012 / Oct. 15, 2012.
Power Trends 2014—Evolution of the Grid.
"California ISO—Fast Facts: What the duck curve tells us about managing a green grid"; California Independent System Operator.
"APOGEE—Building Automation"; Answers for Infrastructure; www.siemens.com.
"A National Assessment of Demand Response Potential"; Federal Energy Regulatory Commission; Jun. 2009.
"Public Service Commission Rates & Tariffs"; conEdison; www. nyiso.com.
"Energy Saving Programs"; www.coned.com/en/save-money/energy-saving-programs; conEdison.
"Commerical Buildings Energy Consumption Survey (CBECS)"; 2012 CBECS Preliminary Results; eia U.S. Energy Information Administration; www.eia.gov/consumption.
"Cyber-Physical Systems—Are Computing Foundations Adequate?"; Edward A. Lee; Department of EECS, UC Berkeley; Position Paper for NSF Workshop on Cyber-Physical Systems: Research Motivation, Techniques and Roadmap; Oct. 16-17, 2006; Austin, TX.
PCT International Search Report and Written Opinion of International Searching Authority dated Jun. 11, 2018 corresponding to PCT International Application No. PCT/US2018/021523 filed Mar. 8, 2018.

* cited by examiner

BUILDING ENERGY SPLIT CALCULATION AND VISUALIZATION

GOVERNMENT INTERESTS

This invention was made with United States Government support under Department of Defense (DOD) contract W912HQ-13-C-0043. The government has certain rights in the invention.

TECHNICAL FIELD

The present disclosure relates generally to methods, systems, and apparatuses for splitting whole building energy measurements across a plurality of zones in the building. The technology described herein may be applied, for example, to provide building occupants with an individualized view of their energy consumption.

BACKGROUND

Energy bills for current commercial building are calculated at the building level, not at the individual occupant or occupant group level. As a result, individual occupants do not know how to improve the energy efficiency of the whole building. However, research shows that proper personalize energy usage visualization can motivate occupants to achieve more energy savings. These methods include, but not limited to: energy games, optimal incentive designs, green tenant contract, individual energy dashboards, etc.

Ultimately, it is desired to provide techniques for measuring how energy is used by individuals or groups of individuals within a space. These measurements are referred to herein as "energy splits." To determine energy splits, one could install additional hardware sensors to monitor energy usage, for example, at the individual room or zone level. However, the adding of sensors to an existing building often requires a considerable investment.

SUMMARY

Embodiments of the present invention address and overcome one or more of the above shortcomings and drawbacks, by providing methods, systems, and apparatuses that use a software-centric approach for determining energy splits which can operate with or without additional hardware installation. Using the techniques described herein, energy split algorithms can be applied to motivate individuals or groups of individuals to make better use of energy resources.

According to some embodiments, a computer-implemented method of splitting whole building energy consumption includes collecting sensor data from Variable Air Volume (VAV) boxes in a building, an electric meter in the building, and a gas meter in the building. The total heating energy consumption is split across a plurality of zones within the building using the sensor data, thereby yielding heating energy consumption for each zone. The total cooling energy consumption is split across the zones using the sensor data (thereby yielding cooling energy consumption for each zone) and the total ventilation energy consumption is split across the of zones using the sensor data (thereby yielding ventilation energy consumption for each zone). Zone energy consumption by aggregating the heating energy consumption for the zone, the cooling energy consumption for the zone, and the ventilation energy consumption for the zone. Additionally, in some embodiments, an energy index is determined for each zone by dividing zone energy consumption for the zone by an area associated with the zone and a number of occupants of the zone. In some embodiments, a visualization is provided each zone the building with an indication of the zone energy consumption overlaying each zone.

Various additional refinements, enhancements, or other modifications may be made to the aforementioned method in different embodiments. For example, in some embodiments, the zones corresponding to individual VAV boxes within the building. Additionally, the total heating energy consumption may be determined based on sensor data from a Roof Top Unit (RTU) or an Air Handling Unit (AHU) installed on the building. In some embodiments, the total cooling energy consumption is determined by measuring a chilled water supply temperature and a chilled water return temperature associated with the building and calculating the total cooling energy consumption used based on a comparison of the chilled water supply temperature and the chilled water return temperature. The total ventilation energy consumption may be determined by measuring a maximum power of a supply fan and a maximum power of a return fan associated with a ventilation system in the building and calculating the total ventilation energy consumption used by the building based on the maximum power of the supply fan and the maximum power of the return fan. The total ventilation energy consumption may split across the zones by determining the total ventilation power and the flow rate associated with each zone. Next, a weighting facto is determined based on the flow rate associated with the zone and the flow rate of the supply fan. Additionally, ventilation power each zone is determined by applying the weighting factor corresponding to the zone to the total ventilation power used by the building. Then, the ventilation energy consumption for each zone may be determined by scaling the ventilation power of the zone by a sampling time associated with the ventilation system.

According to another aspect of the present invention, a second computer-implemented method of splitting whole building energy consumption includes determining total energy consumption for a building and collecting sensor data from a plurality of VAV boxes in a building. The total energy consumption for a building is split across a plurality of zones using the sensor data to yield a measurement of zone energy consumption for each zone. In some embodiments, an occupant dashboard is presented to an occupant located in a first zone. This occupant dashboard provides visualization of the first zone overlaid by a visual indicator of zone energy consumption for the first zone. In other embodiments, the occupant dashboard provides visualization of energy usage of the first zone compared to one or more neighboring zones. Additionally, the occupant dashboard may provide visual indications of comfort levels in the first zone and the one or more neighboring zones.

In the aforementioned second method, the sensor data may include data from additional sources such as an electric meter, a gas meter, and one or more lighting system sensors. In some embodiments, each zone corresponds to an occupant and the method further includes receiving a monetary cost associated with making one or more modifications to the building and determining a suggested division of the monetary cost over the occupants based on the measurement of zone energy consumption for each zone.

According to other embodiments of the present invention, a system of splitting whole building energy consumption includes a plurality of VAV sensors located in VAV boxes within a building, an electric meter sensor, a gas meter sensor, and an energy split computer comprising a plurality of processors. The processors are configured, for example via software instructions, to collect sensor data from the plurality of VAV sensors, the electric meter sensor, and the gas meter sensor. Additionally, the processors are configured to split total energy consumption for a building across a plurality of zones using the sensor data to yield a measurement of zone energy consumption for each zone.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

The present invention relates generally to methods, systems, and apparatuses related to commercial building energy split calculations and visualization techniques. Briefly, total energy consumption for a building is determined. Sensor data from VAV boxes and other sensors is collected and used to split total energy consumption for a building across zones of the building to yield a measurement of zone energy consumption for each zone. As described in greater detail below, the techniques described herein may be applied to provide visualizations of occupant energy usage to facility managers, as well as individual occupants. Additionally, the energy split technology may be leverage for other applications such as energy games, green tenant contracts, and incentive design systems.

Figure 1:
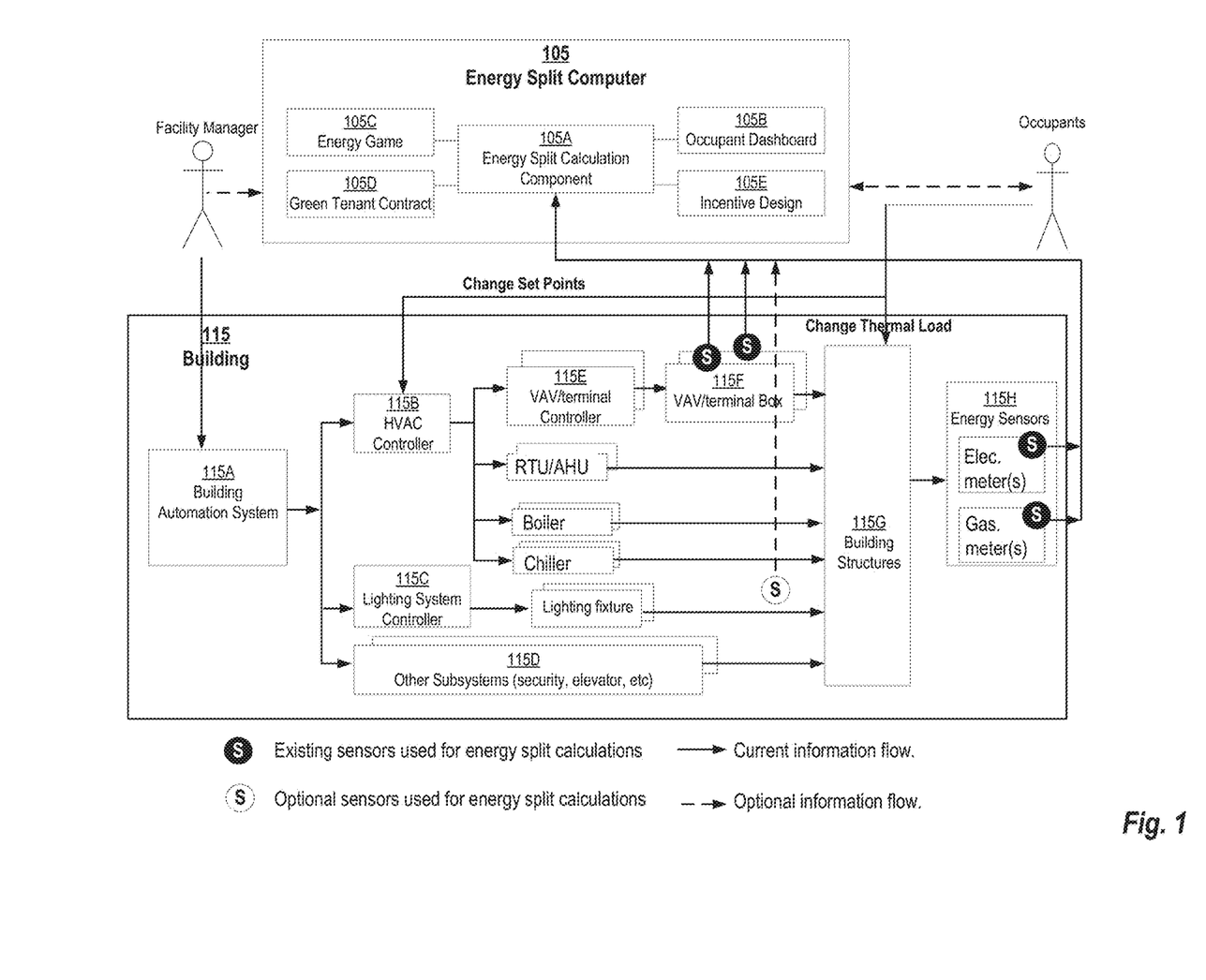
FIG. 1 provides an example architecture for performing building energy split calculations and related techniques, according to some embodiments of the present invention.

FIG. 1 provides an example architecture 100 for performing building energy split calculations and related techniques, according to some embodiments of the present invention. At the highest level, the architecture 100 includes an Energy Split Computer 105 and a Building 115. In some embodiments the Energy Split Computer 105 is located within the Building 115. In other embodiments, the Energy Split Computer 105 and the Building 115 are connected over one or more computer networks (not shown in FIG. 1). This computer network can generally be any network known in the art including the Internet.

The Building 115 includes a Building Automation System (BAS) 115B. The BAS 115A is a computing system that provides automatic centralized control of the Building's 115 various systems (e.g., mechanical, electronics, and lighting systems). For example, a BAS 115A may be used to keep the temperature in the Building 115 within a specified range, turn lighting systems on or off during certain times, etc. A conventional BAS 115A generally operates according to a fixed schedule, maximum occupancy assumptions, and fixed occupant comfort ranges at all times, and does not utilize all available information when managing energy consumption in a building.

The BAS 115A allows the Facility Manager to interface with controllers for the Building 115. In the example of FIG. 1, two controllers are shown Heating, Ventilation and Air Conditioning (HVAC) Controller 115B and Lighting System Controller 115C. Additionally, the BAS 115A may interface with Subsystems 115D such as the security system, the elevator system, etc. for the Building 115. Each controller provides control over the specific features of the Building 115. In FIG. 1, a Variable Air Volume (VAV) is used. Thus, the HVAC Controller 115B uses a VAV/Terminal Controller 115E to control air flow to one or more VAV/terminal Boxes 115F. The various HVAC units, lighting fixtures, and other subsystems directly interface with various building structures to provide heat, cooling, lighting, etc. to the Occupants of the Building 115. The Occupants can interface with the Building Structures 115G to change thermal loads and change HVAC set points (e.g., via a thermostat) which, in turn have effects on thermos loads and electric loads. Energy Sensors 115H such as electric and gas meters collect information on energy usage by the Occupants.

The Building includes a plurality of sensors that collect information related to energy usage. In the example of FIG. 1, four sensors are shown corresponding to sensors available in conventional building systems. In the figure, these sensors are denoted by black filled circles with a white "S." As shown a sensor is present on each VAV/terminal Boxes 115F, as well as the electric and gas meters included in the Energy Sensors 115H. These sensors typically interface with the BAS 115A or electric companies; however, in this example, the Energy Split Computer 105 also collects information from these sensors. In some embodiments, the BAS 115A may be modified to deliver the sensor data to the Energy Split Computer 105. In other embodiments, the Energy Split Computer 105 may include functionality for directly interfacing with the sensors. Note that, because these sensors are already available in the building structure, there is not a need to install additional sensors. However, if additional sensors are available, this information can also be used by the Energy Split Computer 105. For example, as shown in FIG. 1, a lighting sensor (denoted by the white circle with an "S") collects information on lighting usage and makes that information available to the Energy Split Computer 105.

The Energy Split Computer 105 may be implemented generally using any computing hardware known in the art; however, the Energy Split Computer 105 is preferably implemented in a server-based computer with computing resources supporting accessibility from a Facility Manager, as well as access to the BAS 115A. Thus, for example, the Energy Split Computer 105 may include one or more software interfaces or application program interfaces (API) which allow access to the various features of the Energy Split Computer 105. These features are described in more detail below. Optionally, the Energy Split Computer 105 may include functionality which allows Occupants to view information such as their individual energy usage, energy usage goals, incentives for meeting those goals, etc.

Additionally, to support complex computation of energy split information and other processing tasks, in some embodiments, the Energy Split Computer 105 may be implemented in a parallel computing environment where processing tasking may be divided across one or more processing resources, for example, using software such as Map/Reduce. For example, in one embodiment, the Energy Split Computer 105 is implemented in a NVIDIA CUDA® computing environment.

Figure 2A:
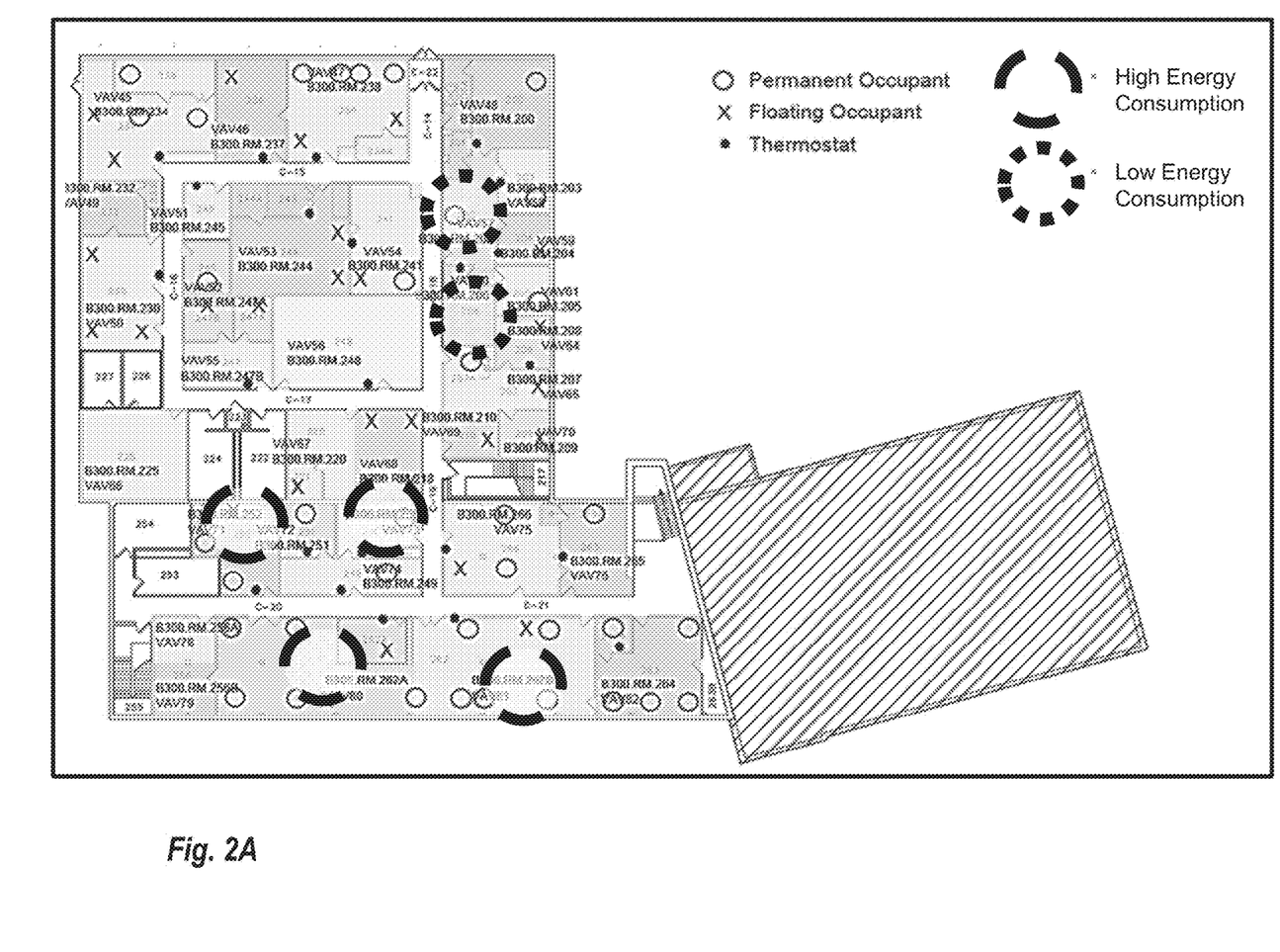
FIG. 2A shows an example of the Occupant Dashboard, as it may be displayed in some embodiments.

The Energy Split Computer 105 includes a variety of components that leverage the information provided by the Energy Split Calculation Component 105A. For example, the Occupant Dashboard 105B is an energy dashboard that visualizes the energy impacts of individual occupant. This dashboard can be implemented using any graphical user interface (GUI) generally known in the art. FIG. 2A shows an example of the Occupant Dashboard 105B, as it may be displayed in some embodiments. Here, circular visual indicators are overlaid onto a building floor plan to show areas of high energy consumption and low energy consumption. In general any type of visual indicator can be used for denoting energy information. Thus, in other embodiments, GUIs may be used which employ different colors, shapes, patterns, etc. for indicating different levels of energy consumption.

The Energy Game Component 105C of the Energy Split Computer 105 is a software platform that allows occupants to compete energy savings in a gaming style. These games may include, for example, games that allow occupants to win rewards based on how their energy consumption compares to other occupants. For example, in one embodiment, the game allows occupants to earn points based on how much they reduce their individual consumption or the overall consumption of the Building 115. Based on the number of points, occupants could be given monetary rewards, gift cards, etc. In some embodiments, the Energy Game Component 105C allows the Facility Manager to create these rewards or other incentives. Additionally, the Energy Game Component 105C may create one or more "challenges" for occupants, either automatically or with the input from the Facility Manager 110. These challenges encourage occupants to meet specific energy goals in exchange for certain rewards. In embodiments where these challenges are developed automatically, the Energy Game Component 105C may use feedback from the BAS 115A or sensors the Building 115 to identify areas of concern that should be addressed. For example, if a particular occupant has especially high energy consumption, the occupant can be targeted with a challenge to reduce consumption by a particular amount in exchange for a reward. Further details on the design of incentives are provided below with respect to the Incentive Design Component 105E.

In some embodiments, the Energy Game Component 105C hosts one or more apps in a server type environment. This allows occupants to view their information using their desktop computer or mobile device. In other embodiments, the Energy Game Component 105C can provide backend support for game apps executed directly on an occupant's mobile device. For example, an occupant may download a game app from an App Store (e.g., Apple App Store, Android Market, etc.). The mobile app may then communicate with the Energy Game Component 105C to store and transmit information with the other components of the Energy Game Component 105C.

The Green Tenant Contract Component 105D is a software platform that enables commercial building tenants and building owners to share energy costs and retrofitting costs. In this case, one or more of the "occupant" in FIG. 1 is a tenant. A "green tenant contract" is a lease agreement between a tenant and building owner that sets forth certain standards and goals for operating a building in an environmentally-friendly manner. Typically, the costs for meeting these standards and goals are divided among the various tenants without any understanding of how individual tenants are using the leased space in an environmentally-friendly manner. For example, costs may be divided equally across different units or floors within the leased building. However, such a division, provides no incentives for individual tenants to make their practices more environmentally-friendly beyond the minimal standards. Moreover, a tenant leasing a small space may unfairly share energy costs and retrofitting costs with a larger space in the Building 115. The Green Tenant Contract Component 105D addresses these issues by using energy split data to confirm contractual standards are being met and to suggest cost allocation among tenants.

In some embodiments, the Green Tenant Contract Component 105D allows a building owner to automate the process of ensuring that a tenant's contractual obligations are being met. For example, in one embodiment, each tenant's obligations are inputted into the Green Tenant Contract Component 105D (e.g., through direct input or by parsing an agreement). These obligations can then be parsed to see if there are any triggers based on energy use. For example, a contractual provision may escalate a tenant's rent if energy use is above a certain amount in comparison to the other tenant. Using energy split data, the Green Tenant Contract Component 105D can evaluate the tenant's energy usage and determine whether rent should be escalated.

The Green Tenant Contract Component 105D may also divide retrofitting costs to be divided across tenants based on energy use. For example, a building owner may need to install a new heating system to support an environmental regulation. Using energy split data, the Green Tenant Contract Component 105D provides the Building 115 owner with suggestions on how to divide these costs across the tenants. In some embodiment, the Green Tenant Contract Component 105D also considers provisions in the tenant's contracts when making this suggestion. For example, a tenant's contract may require that building owners spread any retrofitting costs over the life of the contract. In this case, the Green Tenant Contract Component 105D may suggest how to divide to the tenant's costs in a manner that meets this provision.

The Incentive Design Component 105E is a software platform that allows a Facility Manager to allocate proper amount of financial incentives to occupants for their energy friendly behaviors, as determined using the energy split data. Various incentives could be created and managed using the Incentive Design Component 105E. These incentives could be directed at the Building 115 as a whole or they could be directed individual occupants. For example, the facility manager could create a financial reward for the occupant that reduces their consumption by the largest amount for a given period. Using energy split data, the Incentive Design Component 105E can determine when the reward should be allocated and to whom. Then, the Incentive Design Component 105E can deliver an alert the Facility Manager that the reward has been triggered (e.g., via building dashboard) or, in some instances, the Incentive Design Component 105E can provide the reward directly to the occupant. For example, in one embodiment, the Incentive Design Component 105E is integrated with an accounting system (not shown in FIG. 1 that sends monthly rent bills to the occupant. The Incentive Design Component 105E may provide instructions to the accounting system to reduce the rent by the amount of the reward.

The sensors for the energy split algorithm are available in typical commercial buildings already. They include sensors in VAV boxes and existing electric or gas meters. Optional sensors include lighting system sensors, such as plug meters or illumination sensors, etc. The output of the energy split algorithm is more precise if the optional sensors are available. However, more optional sensors imply more initial costs.

The following paragraphs described how the Energy Split Calculation Component 105A can split of whole building energy consumption with respect to four parts: heating, cooling, ventilation and electricity usage. This discussion is intended to provide examples of how energy splitting calculations can be made for many energy usage scenarios where conventional sensors are available. If additional sensors are available, these calculations can be supplemented with additional split algorithms to further refine the overall energy splitting model of the building.

Regarding heat energy, one may first split the total heating energy from one Roof Top Unit (RTU) or Air Handling Unit (AHU). Then, the total heating energy can be split into individual VAV box. For example, the RTU is heated by water, the total heating calculation can be determined as follows:

$$E_h = 0.001 * HWF * |HWS - HWR| * 4.216 * 63.05. \quad (1)$$

In Equation 1, HWF is the hot water flow meter reading and has units of gallon per minute (gpm). HWS and HWR are the hot water supply and return temperature, respectively, each using the unit ° F. $E_h$ is the whole building heating energy in the unit of kWh and $E_{h(i)}$ is the heating energy supplied for the i-th Zone (i-th VAV box). If the RTU is heated by electricity, and there is no submeter available for the RTU, then one can estimate the energy consumption based on the operating time as follows:

$$E_h = T_h P \quad (2)$$

where $T_h$ is the duration of the heating mode and P is the inplate power of the RTU. The heating energy can be split to each VAV by first computing the weight of each zone using their temperature setpoint:

$$W_{h(i)} = |T_{z(i)} - T_{OA}| / \sum_{n=1}^{N_z} W_{h(n)} \quad (3)$$

In Equation 1, $W_{(i)}$ is the weight for the i-th zone; $T_{z(i)}$ is the zone temperature for the i-th zone; $T_{OA}$ is the outdoor temperature; $N_z$ is the number of zones. Using these weights, the total heating energy may be split based on the weight of each zone:

$$E_{h(i)} = E_h W_{(i)}, \quad (4)$$

where $E_{h(i)}$ is the heating energy for the i-th zone.

The cooling energy calculation depends on mode of chilled water pump (CWP). If the CWP is off, then the building total cooling energy $E_c$ is zero. However, if the CWP is on, then $E_c$ may be calculated as follows:

$$E_c = 0.001 * 228 * |CWS - CWR| * 4.216 * 63.05, \quad (5)$$

where CWS and CWR are the chilled water supply and return temperature, respectively. The values of the scaling numbers in the equation above were determined by experimental evaluation of cooling energy usage under typical indoor climate conditions. Under different room temperature, there will be small variations of the constant values in the formula (5). The constant variables are found in ASHRAE handbook (e.g., 2013 ASHRAE handbook fundamentals, ISBN 9781936504459). The weighting factor for cooling energy split is the same as the heating energy split, i.e.

$$W_{c(i)} = |T_{z(i)} - T_{OA}| * F_{CMF(i)} / \Sigma_{n=1}^{N_z} F_{CMF(n)}, \quad (5)$$

where $F_{CMF(i)}$ is the air flow for the i-th VAV box. Then, the cooling energy provided for the i-th VAV box may be determined by applying the weights to $E_c$:

$$E_{c(i)} = E_c W_{(i)}. \quad (6)$$

Regarding ventilation energy, consider a multi-floor building. The power directed to an individual VAV box on the i-th floor may be determined as follows:

$$P_{VB} = P_s * V_s^3 + P_R + V_R^3 \quad (7)$$

$$F_{(i)} = \sum_{j=1}^{M(i)} F_{(i,j)} \quad (8)$$

$$W_{(i)} = \left(\frac{F_{(i)}}{F_s}\right)^3 \quad (9)$$

$$P_{(i)} = W_{(i)} * P_{VB} / \sum_{i=1}^{N} W_{(i)} \quad (10)$$

$$E_{v(i)} = T_s P_{(i)} \quad (11)$$

In Equation 7, $P_s$ and $P_R$ are the max supply and return fan power in kW, while $V_s$ and $V_R$ are the normalized supply and return fun power rate, respectively, from 0% to 100%. $P_{VB}$ is the ventilation power for the whole building. In equations 8 and 9, $F_s$ is the flow rate, in terms of cubic feet per minute (CFM) for the supply fan. The flow rate, in CFM, for the i-th zone is $F_{(i)}$ and $W_{(i)}$: is the weighting factor for the ventilation power at the i-th zone. In Equation 10, the number of zones is N and $P_{(i)}$ is the ventilation power for the i-th zone. Finally in Equation 11, $T_s$ is the sampling time for the system (e.g., 15 min) and $E_{v(i)}$ is the ventilation energy for the i-th zone.

For buildings without sub-metering, the total electricity energy can be allocated based on area:

$$E_{e(i)} = \frac{A_{(i)} E_e}{A_T} \quad (12)$$

In Equation 12, $A_T$ is the total area of the whole building and $A_{(i)}$ is the area for the i-th zone. $E_e$ is the whole building electricity energy consumption, and $E_{e(i)}$ is the electricity energy consumption for the i-th zone.

If there are electricity sub-meters available in the building, then the sub-meter readings may be used for the electricity energy split. Assuming that out of N zones, there are M zones with sub-meters, the energy may be calculated as follows:

$$E_{e(i)} = \frac{A_{(i)}(E_e - \Sigma_{i=1}^M E_{e(i)})}{A_T}, \, i \in \{M+1, M+2, ..., N\} \quad (13)$$

$$E_{e(i)} = \hat{E}_{e(i)}, \, i \in \{1, 2, ..., M\} \quad (14)$$

In these equations, the energy measurement for the i-th zone from a sub-meter is denoted as $\hat{E}_{e(i)}$, where $i \in \{1, 2, \ldots, M\}$. There are no sub-meters from zones from M+1, till the N-th zone. The energy estimation for those zones are denoted as $E_{e(i)}$, where $i \in \{M+1, M+2, \ldots, N\}$.

A given energy consumption may be normalized based on zone area and number of occupants as follows:

$$I_{(i)} = \frac{(E_{h(i)} + E_{c(i)} + E_{v(i)} + E_{e(i)})}{A_{(i)} * N_{(i)}} \quad (15)$$

The energy index is designed for fare comparisons among different zones. In Equation 15, $1_{(i)}$ is the energy index for the i-th zone, $A_{(i)}$ is the area for the i-th zone, and $N_{(i)}$ is the number of occupants in the i-th zone.

Figure 2B:
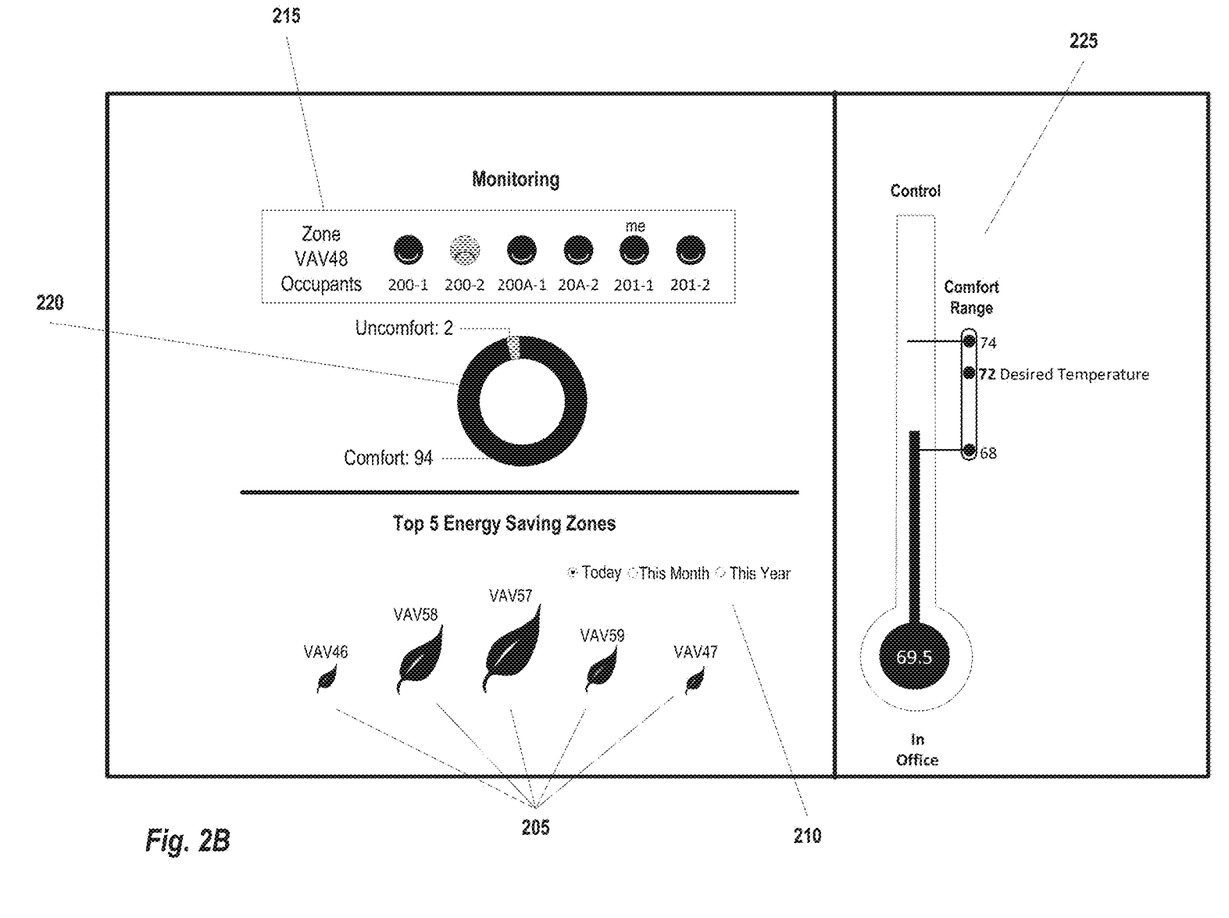
FIG. 2B illustrates an alternative example of the Occupant Dashboard with neighbor energy index icons showing the top energy saving zones within a building, as may be shown in some embodiments.

FIG. 2B illustrates an alternative example of the Occupant Dashboard 105B with neighbor energy index icons 205 showing the top 5 energy saving zones within a building. This view may be presented to an occupant to provide insight into energy savings behaviors compared to neighboring occupants. A selection mechanism 210 (in this example button boxes) allows a user to select daily, monthly, and annual views. The energy index icons 205 visualize the energy efficiency of the neighbor zones. The icons 205 are leafs in this example, but it can be any other graphic items as well. In this example, the smaller the energy index, the larger the leafs. The dashboard may or may not have numerous total energy consumption below the leafs. A Monitoring section 215 of the dashboard provides visual indicators of each occupant or zone's comfort level. In this case, the visual indicators are faces with smiles or frowns, but other indicators may be similarly used. Below the monitoring section 215, a graph 220 provides visual representation of aggregate comfort values. On the right hand side of the dashboard, a control section 225 shows a thermometer depicting the current temperature in a particular zone (in this case 69.5 degrees), along with a "comfort range" showing the maximum and minimum temperature, as well as the desired temperature of the occupant of the zone (72 degrees).

Figure 3:
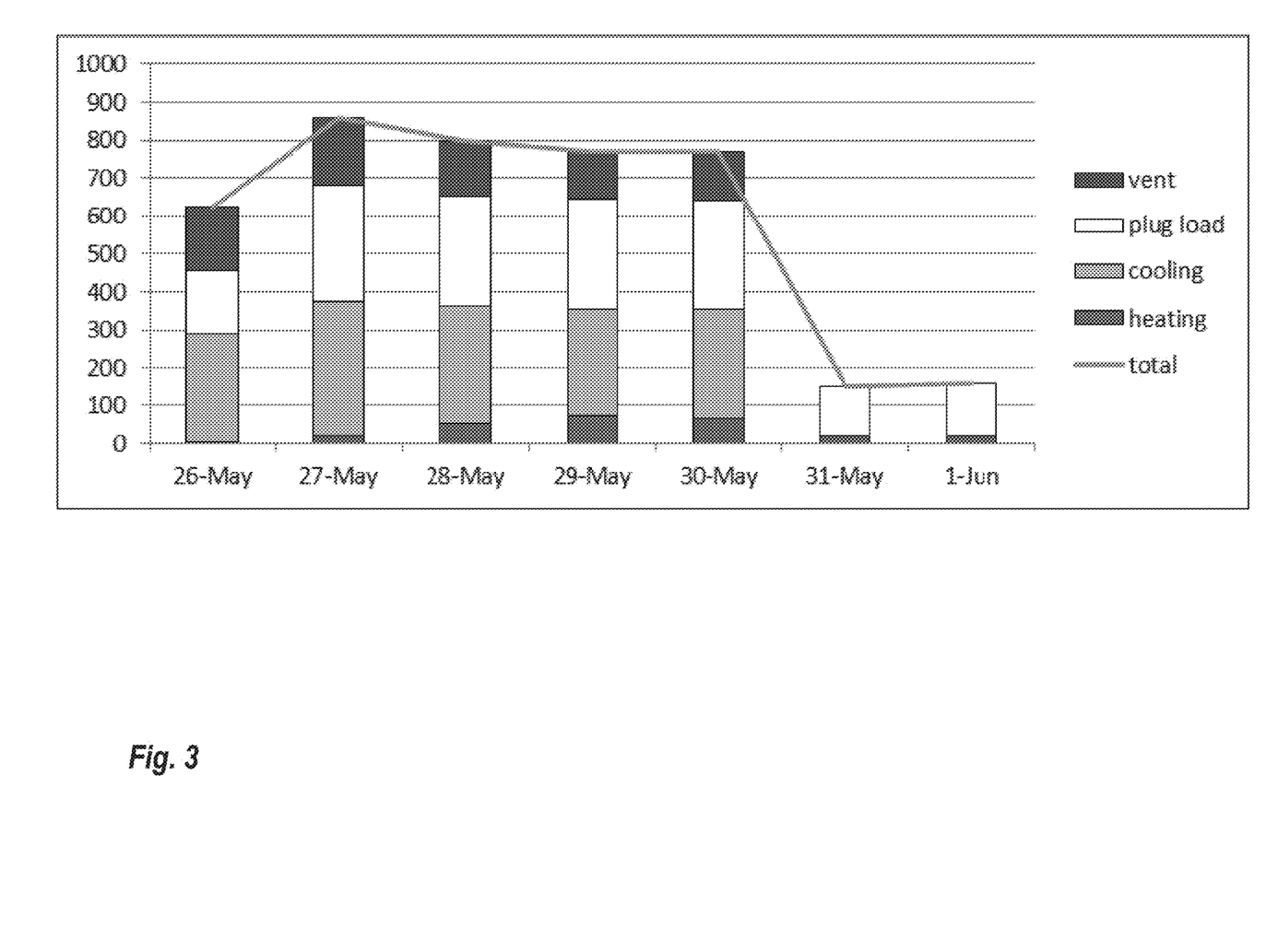
FIG. 3 shows an example of a single zone aggregated time plot.
Figure 4:
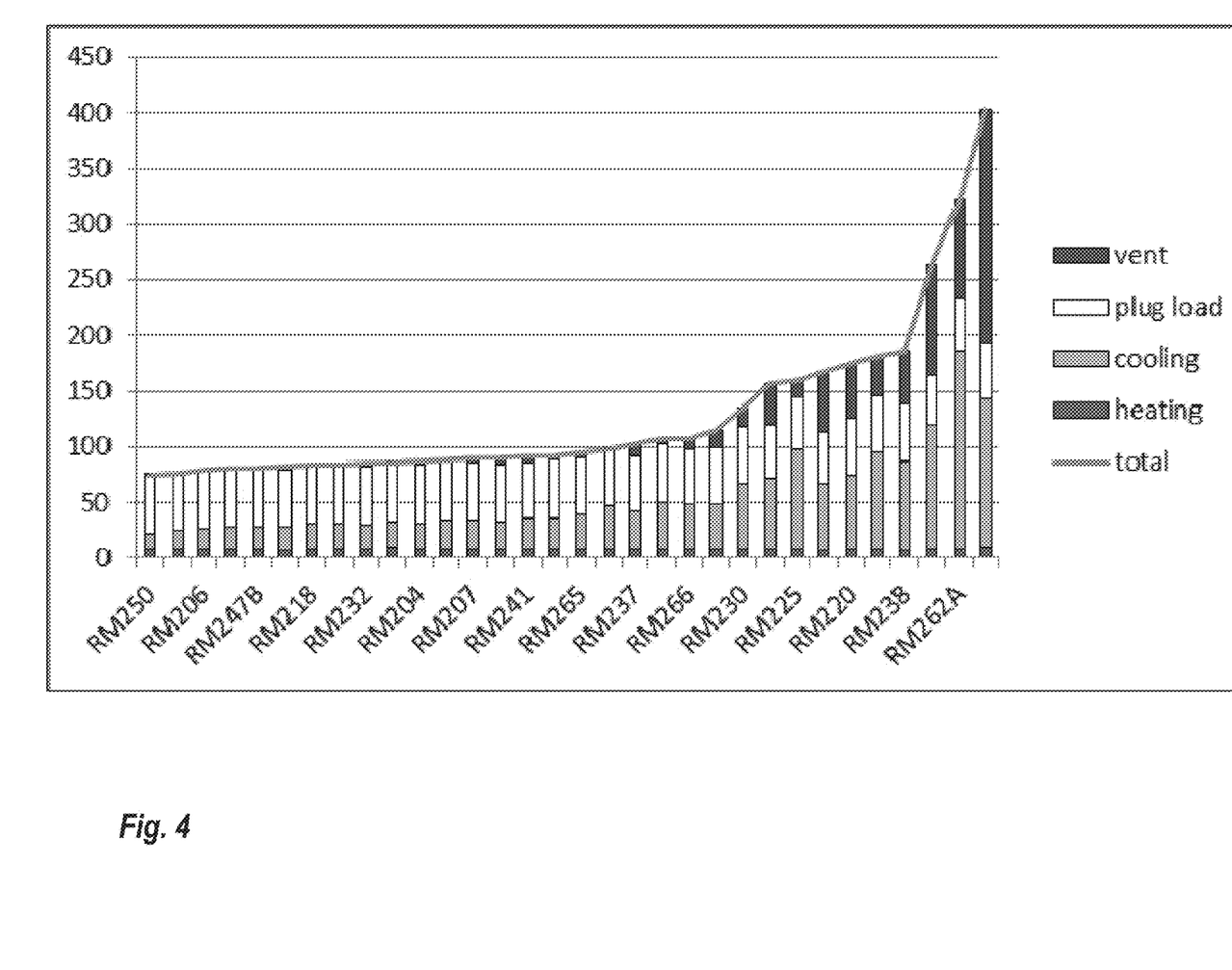
FIG. 4 shows a multi-zone aggregated energy split plot.
Figure 5:
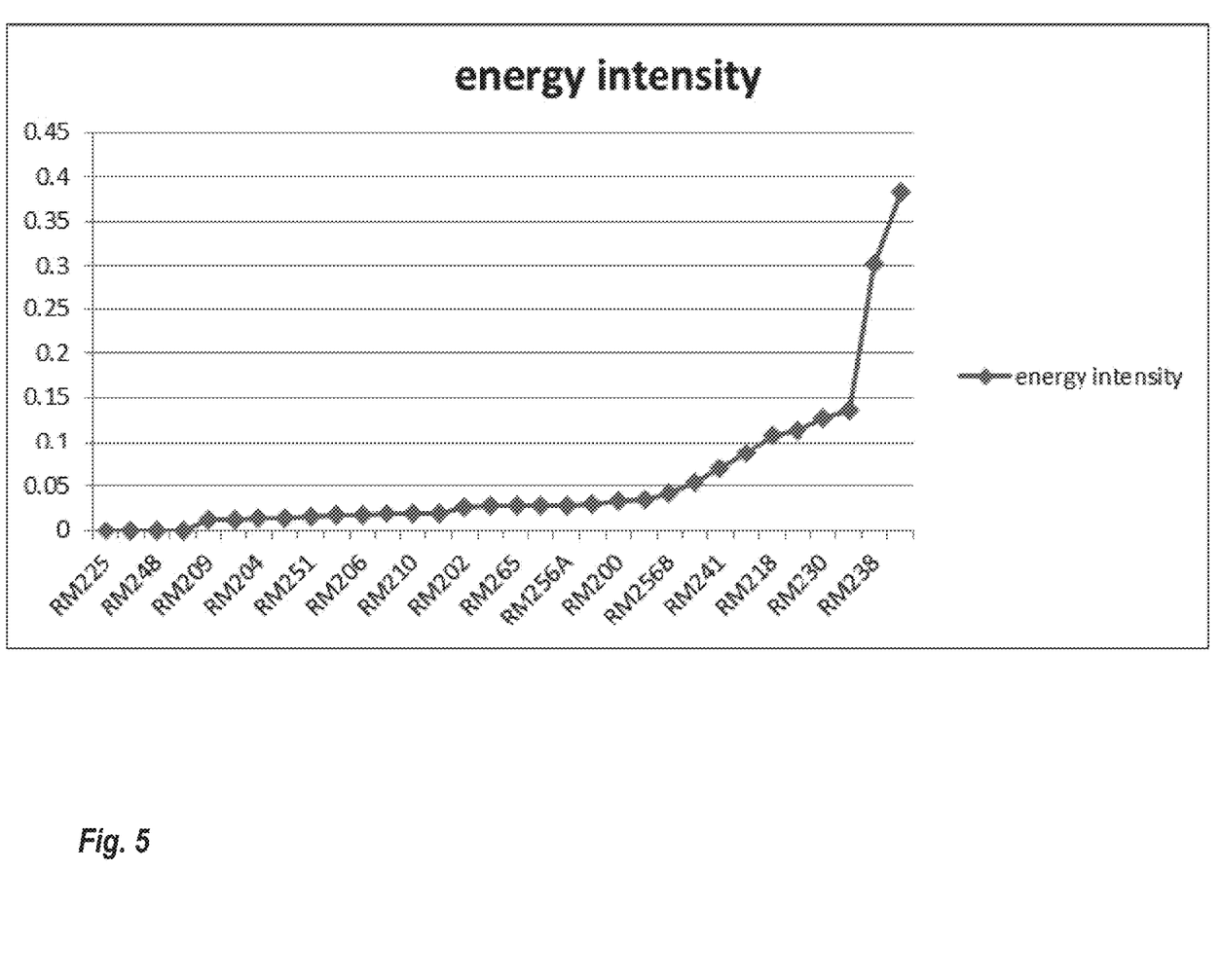
FIG. 5 shows an energy intensity split on aggregation of each zone weekly consumption.

FIGS. 3-5 provide several different techniques for visualizing the output of the energy split algorithm. FIG. 3 shows an example of a single zone aggregated time plot. The y-axis is kilowatts. The x-axis is separated by different time periods. In this example, one period is one week. However, it should be understood that the period can be other periods such as one day, one week, one month, etc. FIG. 4 shows a multi-zone aggregated energy split plot. In this example, the x-axis is the name of each zone and the y-axis is the accumulated energy consumption within a time period. The period in FIG. 4 is one week, but it can generally be any other fix duration as well. FIG. 5 shows an energy intensity split on aggregation of each zone weekly consumption. The x-axis in FIG. 5 are individual rooms; thus, this plot provides a way to compare energy intensity across multiple rooms in a structure.

Figure 6:
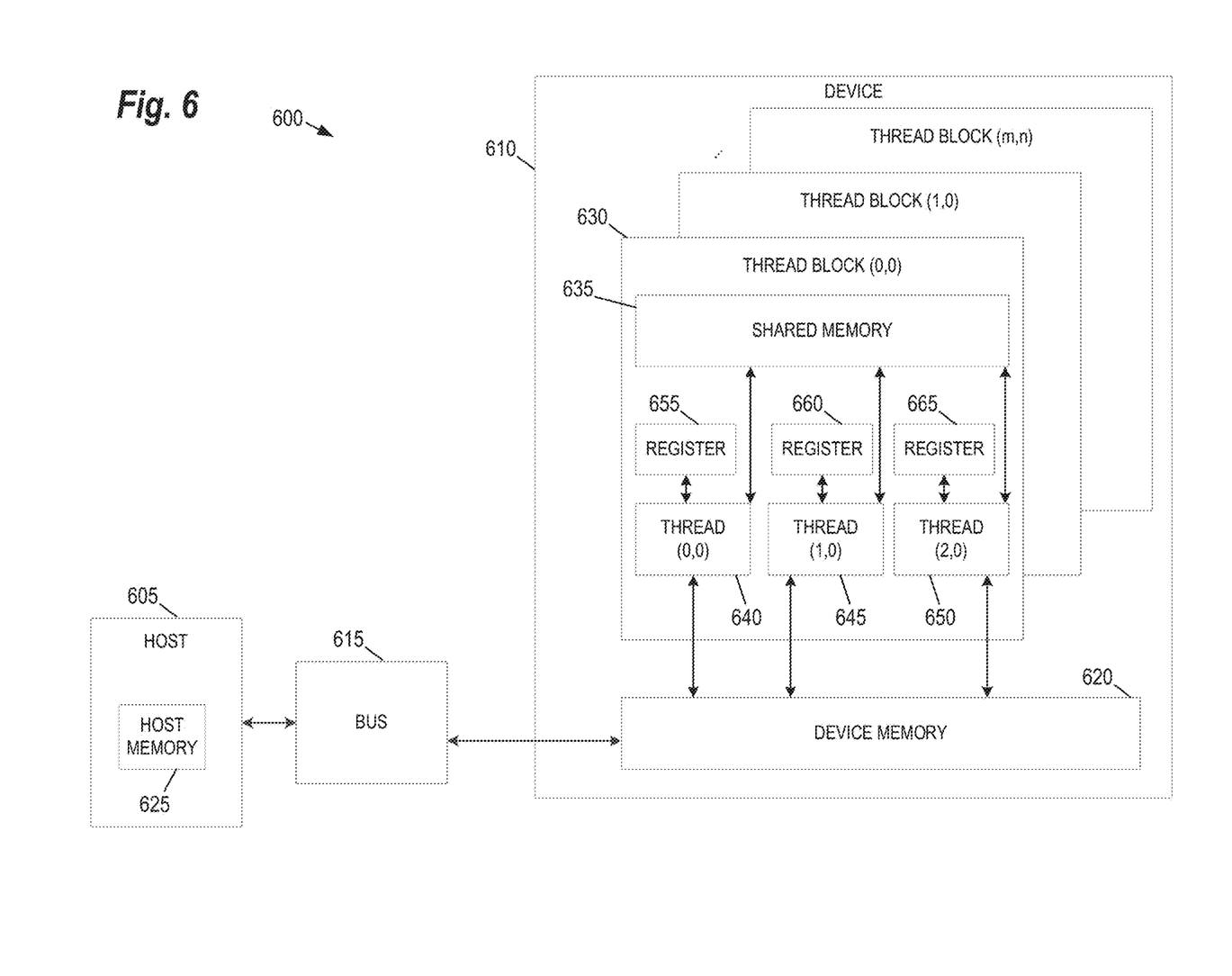
FIG. 6 provides an example of a parallel processing memory architecture that may be utilized to implement perform energy split calculations on the Energy Split Computer shown in FIG. 1, according to some embodiments of the present invention.

FIG. 6 provides an example of a parallel processing memory architecture 600 that may be utilized to implement perform energy split calculations on the Energy Split Computer 105 shown in FIG. 1, according to some embodiments of the present invention. This architecture 600 may be used in embodiments of the present invention where NVIDIA™ CUDA (or a similar parallel computing platform) is used. The architecture includes a host computing unit ("host") 605 and a graphics processing unit (GPU) device ("device") 610 connected via a bus 615 (e.g., a PCIe bus). The host 605 includes the central processing unit, or "CPU" (not shown in FIG. 6), and host memory 625 accessible to the CPU. The device 610 includes the graphics processing unit (GPU) and its associated memory 620, referred to herein as device memory. The device memory 620 may include various types of memory, each optimized for different memory usages. For example, in some embodiments, the device memory includes global memory, constant memory, and texture memory.

Parallel portions of a big data platform and/or big simulation platform (see FIG. 5) may be executed on the architecture 600 as "device kernels" or simply "kernels." A kernel comprises parameterized code configured to perform a particular function. The parallel computing platform is configured to execute these kernels in an optimal manner across the architecture 600 based on parameters, settings, and other selections provided by the user. Additionally, in some embodiments, the parallel computing platform may include additional functionality to allow for automatic processing of kernels in an optimal manner with minimal input provided by the user.

The processing required for each kernel is performed by a grid of thread blocks (described in greater detail below). Using concurrent kernel execution, streams, and synchronization with lightweight events, the architecture 600 of FIG. 6 (or similar architectures) may be used to parallelize portions of the energy split calculation. For example, in some embodiments, the operations of the big data platform may be partitioned such that multiple kernels analyze data from different sensors (e.g., different VAV/terminal boxes) within a structure.

The device 610 includes one or more thread blocks 630 which represent the computation unit of the device 610. The term thread block refers to a group of threads that can cooperate via shared memory and synchronize their execution to coordinate memory accesses. For example, in FIG. 6, threads 640, 645 and 650 operate in thread block 630 and access shared memory 635. Depending on the parallel computing platform used, thread blocks may be organized in a grid structure. A computation or series of computations may then be mapped onto this grid. For example, in embodiments utilizing CUDA, computations may be mapped on one-, two-, or three-dimensional grids. Each grid contains multiple thread blocks, and each thread block contains multiple threads. For example, in FIG. 6, the thread blocks 630 are organized in a two dimensional grid structure with m+1 rows and n+1 columns. Generally, threads in different thread blocks of the same grid cannot communicate or synchronize with each other. However, thread blocks in the same grid can run on the same multiprocessor within the GPU at the same time. The number of threads in each thread block may be limited by hardware or software constraints.

Continuing with reference to FIG. 6, registers 655, 660, and 665 represent the fast memory available to thread block 630. Each register is only accessible by a single thread. Thus, for example, register 655 may only be accessed by thread 640. Conversely, shared memory is allocated per thread block, so all threads in the block have access to the same shared memory. Thus, shared memory 635 is designed to be accessed, in parallel, by each thread 640, 645, and 650 in thread block 630. Threads can access data in shared memory 635 loaded from device memory 620 by other threads within the same thread block (e.g., thread block 630). The device memory 620 is accessed by all blocks of the grid and may be implemented using, for example, Dynamic Random-Access Memory (DRAM).

Each thread can have one or more levels of memory access. For example, in the architecture 600 of FIG. 6, each thread may have three levels of memory access. First, each thread 640, 645, 650, can read and write to its corresponding registers 655, 660, and 665. Registers provide the fastest memory access to threads because there are no synchronization issues and the register is generally located close to a multiprocessor executing the thread. Second, each thread 640, 645, 650 in thread block 630, may read and write data to the shared memory 635 corresponding to that block 630. Generally, the time required for a thread to access shared memory exceeds that of register access due to the need to synchronize access among all the threads in the thread block. However, like the registers in the thread block, the shared memory is typically located close to the multiprocessor executing the threads. The third level of memory access allows all threads on the device 610 to read and/or write to the device memory. Device memory requires the longest time to access because access must be synchronized across the thread blocks operating on the device. Thus, in some embodiments, the processing of each sub-graph is coded such that it primarily utilizes registers and shared memory and only utilizes device memory as necessary to move data in and out of a thread block.

The embodiments of the present disclosure may be implemented with any combination of hardware and software. For example, aside from parallel processing architecture presented in FIG. 6, standard computing platforms (e.g., servers, desktop computer, etc.) may be specially configured to perform the techniques discussed herein. In addition, the embodiments of the present disclosure may be included in an article of manufacture (e.g., one or more computer program products) having, for example, computer-readable, non-transitory media. The media may have embodied therein computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

The invention claimed is:

1. A computer-implemented method of controlling a Building Automation system by splitting whole building energy consumption, the method comprising:
   collecting, by a processor, sensor data from a plurality Variable Air Volume (VAV) boxes in a building, an electric meter in the building, and a gas meter in the building;
   splitting, by a processor, total heating energy consumption across a plurality of zones within the building using the sensor data, thereby yielding heating energy consumption for each zone;
   splitting, by a processor, total cooling energy consumption across the plurality of zones using the sensor data, thereby yielding cooling energy consumption for each zone;
   splitting, by a processor, total ventilation energy consumption across the plurality of zones using the sensor data, thereby yielding ventilation energy consumption for each zone;
   for each zone, determining, by a processor, zone energy consumption by aggregating the heating energy consumption for the zone, the cooling energy consumption for the zone, and the ventilation energy consumption for the zone; and
   changing operating parameters of a Building Automation System based upon the zone energy consumption,
   wherein changing operating parameters of the Building Automation System comprises one or more of changing thermal loads, changing air flow, and changing lighting within the building, wherein the Building Automation System comprises a plurality of controllers that control features within the building.

2. The method of claim 1, wherein the plurality of zones corresponding to individual VAV boxes within the building.

3. The method of claim 2, wherein total heating energy consumption is determined based on sensor data from a Roof Top Unit (RTU) or an Air Handling Unit (AHU) installed on the building.

4. The method of claim 2, wherein the total cooling energy consumption is determined by:
    measuring a chilled water supply temperature and a chilled water return temperature associated with the building; and
    calculating the total cooling energy consumption used based on a comparison of the chilled water supply temperature and the chilled water return temperature.

5. The method of claim 1, wherein the total ventilation energy consumption is determined by:
    measuring a maximum power of a supply fan and a maximum power of a return fan associated with a ventilation system in the building; and
    calculating the total ventilation energy consumption used by the building based on the maximum power of the supply fan and the maximum power of the return fan.

6. The method of claim 5, wherein the total ventilation energy consumption is split across the plurality of zones by:
    determining the total ventilation power used by the building;
    determining a flow rate associated with each zone of the building;
    determining a weighting factor based on the flow rate associated with the zone and the flow rate of the supply fan;
    determining ventilation power each zone by applying the weighting factor corresponding to the zone to the total ventilation power used by the building;
    determining the ventilation energy consumption for each zone by scaling the ventilation power of the zone by a sampling time associated with the ventilation system.

7. The method of claim 1, further comprising:
    determining electricity energy consumption for each zone without an electricity submeter by scaling total electricity energy consumption used by the building by a ratio of an area associated the zone to a total area associated by the building; and
    determining electricity energy consumption for each zone with an electricity submeter using measurements from the electricity submeter,
    wherein the zone energy consumption is further determined based on the electricity energy consumption for the zone.

8. The method of claim 1, further comprising:
    determining an energy index for each zone by dividing zone energy consumption for the zone by an area associated with the zone and a number of occupants of the zone.

9. The method of claim 1, further comprising:
    providing a visualization of each zone the building with an indication of the zone energy consumption overlaying each zone.

* * * * *